United States Patent [19]

Hanawa

[11] Patent Number: 5,343,149
[45] Date of Patent: Aug. 30, 1994

[54] MAGNETIC RESONANCE IMAGING SYSTEM

[75] Inventor: Masatoshi Hanawa, Foster City, Calif.

[73] Assignee: Kabushiki Kaisha Toshiba, Kawasaki, Japan

[21] Appl. No.: 94,916

[22] Filed: Jul. 22, 1993

Related U.S. Application Data

[63] Continuation of Ser. No. 644,530, Jan. 23, 1991, abandoned.

[30] Foreign Application Priority Data

Jan. 24, 1990 [JP] Japan ................................ 2-12471

[51] Int. Cl.$^5$ .............................................. G01V 3/00
[52] U.S. Cl. ...................................... 324/314; 324/307
[58] Field of Search .............. 324/314, 307, 309, 313, 324/318, 322

[56] References Cited

U.S. PATENT DOCUMENTS

| | | | |
|---|---|---|---|
| 4,675,608 | 6/1987 | Hanawa et al. | 324/314 |
| 4,739,267 | 4/1988 | LeRoux et al. | 324/314 |
| 4,788,501 | 11/1988 | Le Roux et al. | 324/314 |
| 4,799,014 | 1/1989 | Nakabayashi | 324/314 |
| 4,806,867 | 2/1989 | Hanawa et al. | 324/314 |
| 4,866,386 | 9/1989 | Sattin | 324/314 |

FOREIGN PATENT DOCUMENTS

| | | |
|---|---|---|
| 0238139 | 9/1987 | European Pat. Off. |
| 0245154 | 11/1987 | European Pat. Off. |
| 3742490 | 6/1988 | European Pat. Off. |
| 0391279 | 10/1990 | European Pat. Off. |
| 3605162 | 8/1986 | Fed. Rep. of Germany |

OTHER PUBLICATIONS

William H. Perman et al., "A Method for Correctly Setting the rf Flip Angle", *Magnetic Resonance In Medicine*, 9 (1989) Jan., No. 1, Duluth, Minn, US, pp. 16–24.

*Primary Examiner*—Louis Arana
*Attorney, Agent, or Firm*—Foley & Lardner

[57] ABSTRACT

In a magnetic resonance imaging system having an automatic power control function for adjusting the transmission power of an RF pulse so as to set a desired flip angle of a spin, in an automatic power control mode, a plane including only a portion of an object to be examined in an imaging region having a uniform field intensity, e.g., a transaxial plane or a plane slightly inclined from the transaxial plane is excited by a gradient magnetic field Gz in the direction of the body axis of the object as a slice gradient magnetic field regardless of a plane to be imaged. The peak values of MR echo signals are detected while the transmission power of the RF pulse is changed. An RF pulse transmission power at which the maximum peak value appears is detected from these detection values. The transmission power of the RF pulse in imaging, i.e., the output of an RF oscillator having a predetermined frequency, is attenuated on the basis of the relationship between the transmission power and the maximum peak value, thereby adjusting the attenuation amount of an attenuator for supplying a current to an RF coil.

9 Claims, 4 Drawing Sheets

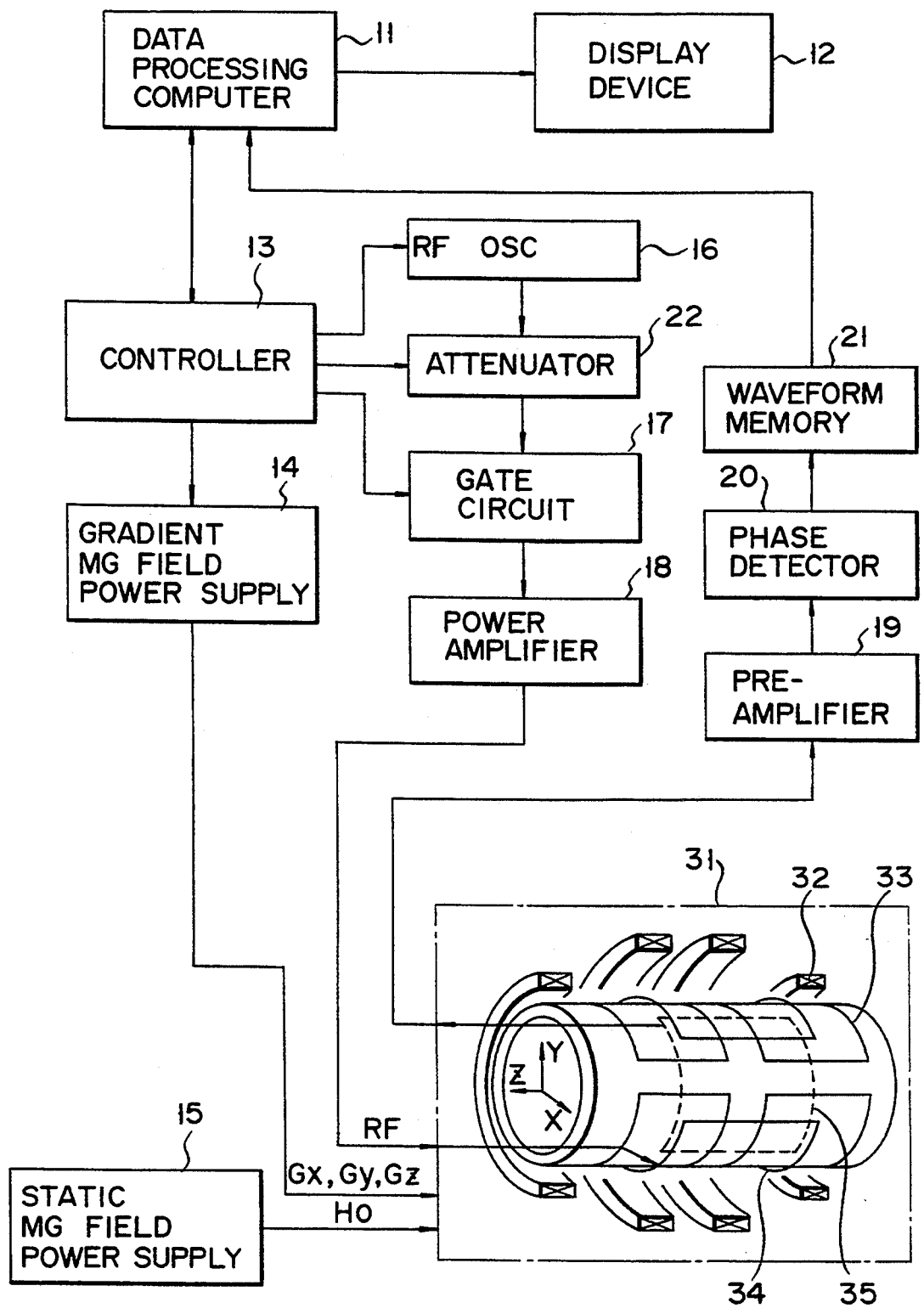
F I G. 4

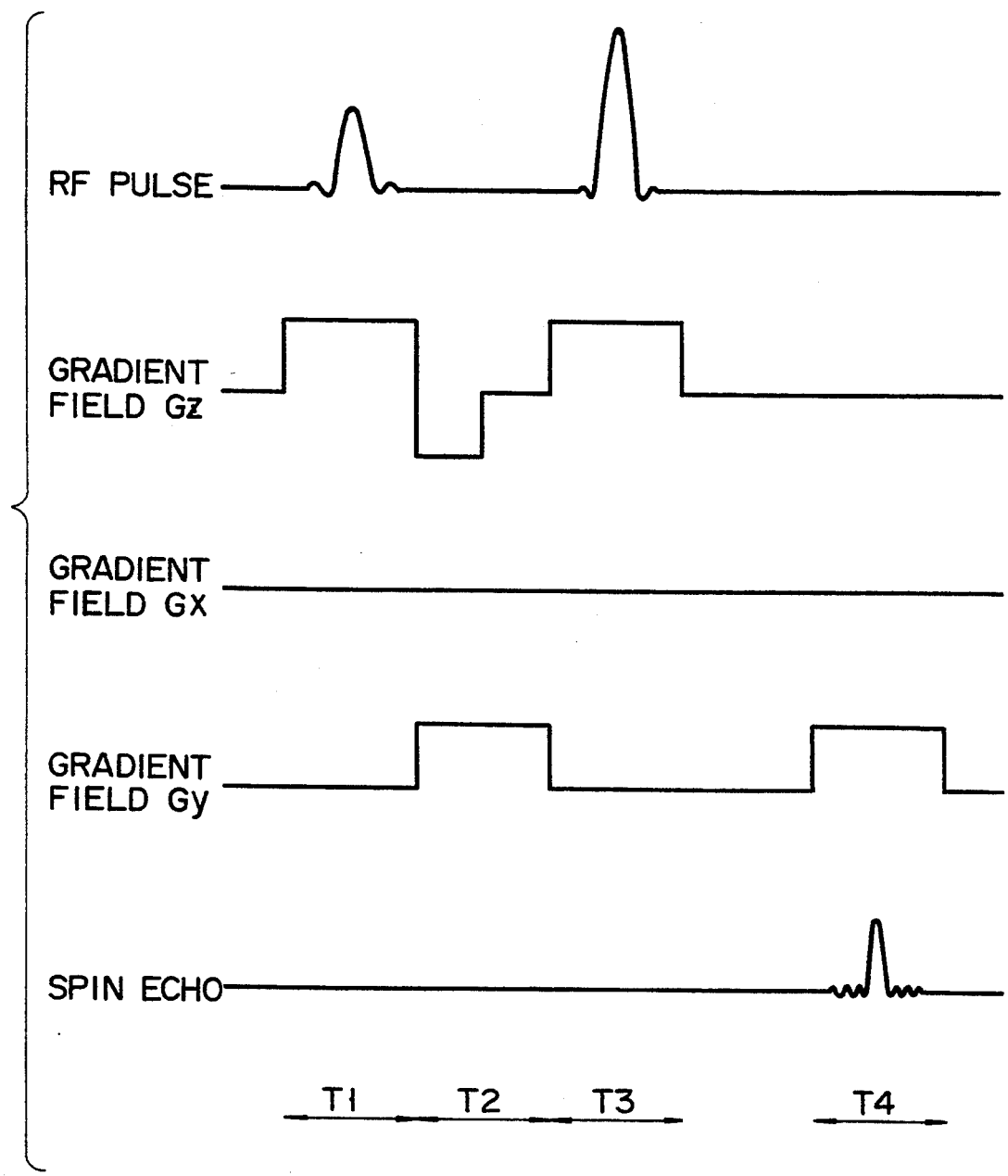
F I G. 5

MAGNETIC RESONANCE IMAGING SYSTEM

This application is a continuation of application Ser. No. 07/644,530, filed Jan. 23, 1991, now abandoned.

BACKGROUND OF THE INVENTION

1. Field of the Invention

The present invention relates to a magnetic resonance imaging (MRI) system for applying a gradient magnetic field and a radio frequency (RF) pulse to an object to be examined which is placed in a static magnetic field so as to excite a magnetic resonance at a specific portion of the object, acquiring a magnetic resonance (MR) echo signal induced by the magnetic resonance, and obtaining image data such as a slice image of the specific portion and/or analytic data such as spectroscopic data from the MR echo signal data by performing predetermined image reconstruction processing and, more particularly, to adjustment of the transmission power of the RF pulse.

2. Description of the Related Art

In such an MRI system, since a flip angle $\theta$ of a spin is proportional to the intensity of the RF pulse, as an excitation RF magnetic field normally is applied in the form of a pulse, the RF field intensity must be properly set to set a desired flip angle. In order to control this field intensity, the transmission power of the RF pulse must be properly controlled.

In a conventional system, prior to actual imaging, magnetic resonance is excited in a plane to be imaged while the transmission power of an RF pulse is changed in a predetermined range, and the field intensities of the RF pulse, i.e., MR echo signals, are measured. The RF pulse transmission power at which the maximum peak value of an MR echo signal appears is obtained on the basis of the measurement result. The transmission power of the RF pulse for imaging is controlled on the basis of the RF pulse transmission power having the maximum peak value so as to set a desired flip angle of a spin. Such control is called automatic power control.

In conventional automatic power control, however, if a plane to be imaged is a sagittal plane (a vertical plane extending along the body axis) or a coronal plane (a horizontal plane extending along the body axis) other than a transaxial plane (perpendicular to the body axis), the following problems are posed. The field intensity of an RF pulse transmitted from an RF transmission coil is uniform only in a predetermined region covered within an internal space of a transmission coil, and this region is defined as an imaging region. However, since an RF transmission coil and an RF reception coil (sometimes a single RF coil may serve as these two coils) are sensitive in a wide range outside the imaging region, a region excited by the RF pulse includes a portion outside the imaging region, in which the RF field intensity is not uniform.

It is assumed, as shown in FIG. 1, that an object P is placed in an RF coil 1 as a transmission/reception coil so as to perform imaging of an abdominal portion P1 of the object P. Although the abdominal portion P1 is placed in the imaging region (hatched portion), if the object is a person other than infants, the legs and the head are placed outside the transmission coil 1. For this reason, when a tomographic image of a sagittal plane or a coronal plane is to be obtained, regions (legs and head) having nonuniform RF field intensities, other than the imaging region are also excited and MR echo signals therefrom are acquired. When a transaxial plane is to be imaged, since it includes no portions, of the object located outside the imaging region, no MR echo signals from the outside the imaging region are acquired.

If an MR echo signal obtained in this case, e.g., a spin echo signal, is represented by S(t), with projection data $F(\omega)$ obtained by performing a Fourier transform of S(t), the projection data $F(\omega)$ is represented as follows:

$$F(\omega) = \int S(t) e^{i\omega t} dt \quad (1)$$

It is noted that the z direction is a read direction in this case.

FIG. 2 shows a relationship between the projection data $F(\omega)$ and $\omega$. If equation (1) is subjected to an inverse Fourier transform, the spin echo signal S(t) is represented as follows:

$$S(t) = a \int F(\omega) e^{-i\omega t} d\omega \quad (2)$$

where a is a constant.

FIG. 3 shows the relationship between the spin echo signal S(t) and t. According to equation (2), a peak value So of the spin echo signal, i.e. the signal at t=0, corresponds to the area of the projection data $F(\omega)$ in the following manner:

$$So = a \int F(\omega) d\omega \quad (3)$$

When the sagittal plane or the coronal plane of the abdominal portion P1 in FIG. 1 is to be imaged, the projection data $F(\omega)$ obtained includes signal components from portions outside the imaging region in addition to a signal component P2 corresponding to only the abdominal portion P1, as shown in FIG. 2. As a result, the spin echo signal So obtained by integrating the data $F(\omega)$ inevitably includes signals from outside the imaging region.

As described above, in the conventional automatic power control system, when a condition in which a spin echo having the maximum or minimum peak value appears, is to be obtained, regions having nonuniform field intensities and located outside an imaging region are excited, and signals from these regions are also acquired. Therefore, an optimal transmission power, i.e. an optimal transmission power condition for a 90° or 180° pulse, cannot be obtained. For this reason, the flip angle of a spin deviates from a preset value, and the contrast of the image obtained is deteriorated.

SUMMARY OF THE INVENTION

It is an object of the present invention to provide a magnetic resonance imaging system which can adjust the transmission power of an RF excitation pulse so as to set the flip angle of a spin to be a desired value.

According to the present invention, there is provided a magnetic resonance imaging system comprising means for applying an RF pulse, a static magnetic field, and a gradient magnetic field to an object to be examined prior to imaging, thereby exciting a transaxial plane crossing a body axis of the object, means for detecting a magnetic resonance signal generated by the excitation and for detecting a peak value of the magnetic resonance signal, and means for detecting the transmission power at which a maximum peak value of a magnetic resonance signal appears while changing the transmission power of the excitation pulse, and determining excitation pulse transmission power for imaging on the basis of the transmission power at which the maximum peak value is detected.

According to the present invention, since a transaxial plane of the object can be excited without exciting regions having nonuniform field intensities, an RF pulse transmission power at which the maximum peak value of magnetic resonance signals, measured at the transaxial plane, appears is obtained, and the transmission power of an RF pulse for imaging is controlled on the basis of the obtained RF pulse transmission power. With this operation, the flip angle of a spin can be set to be a desired value, and hence image data having excellent contrast can be obtained.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 4 is a block diagram showing an MRI system according to an embodiment of the present invention;

FIG. 5 is a timing chart showing a pulse sequence in the first embodiment;

DETAILED DESCRIPTION OF THE PREFERRED EMBODIMENTS

Figure 1:
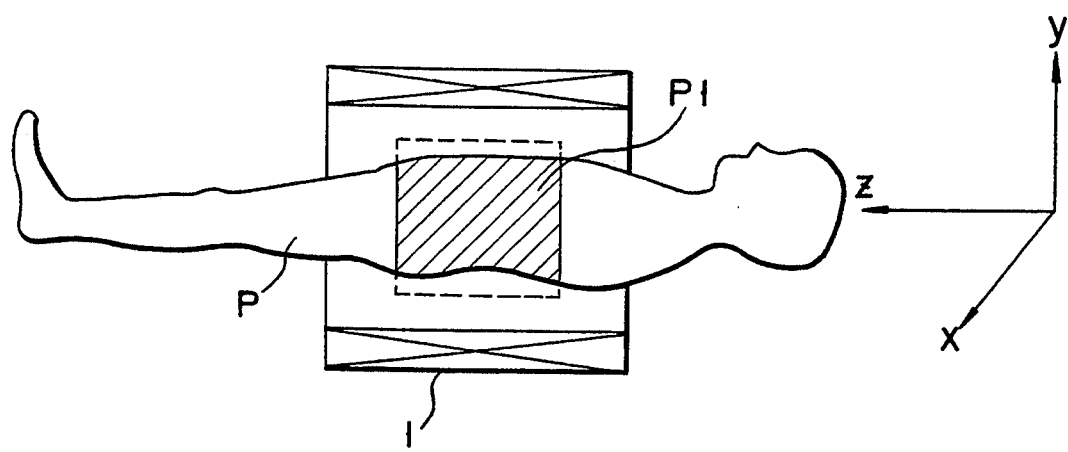
FIG. 1 is a view, showing a state wherein an abdominal portion is imaged, for explaining a conventional automatic power control method.
Figure 2:
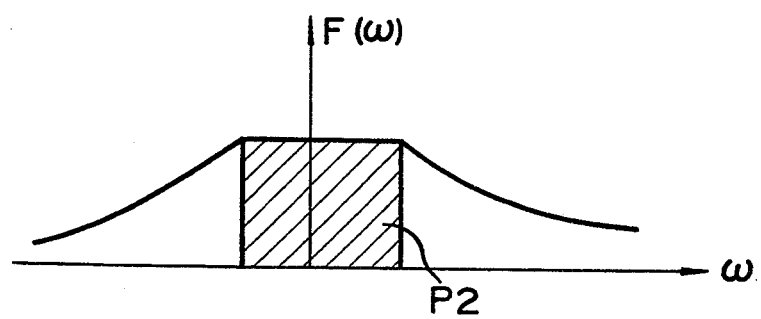
FIG. 2 is a graph showing projection data acquired in the system shown in FIG. 1.
Figure 3:
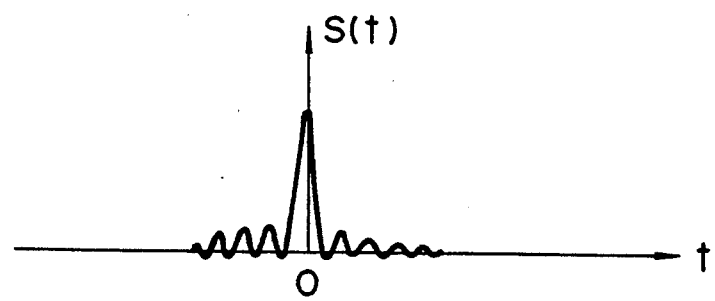
FIG. 3 is a graph showing a spin echo signal obtained in the system shown in FIG. 1.

A magnetic resonance imaging (MRI) system according to an embodiment of the present invention will be described below with reference to the accompanying drawings. FIG. 4 is a block diagram showing the overall arrangement of the embodiment. A data processing computer 11 is connected to a controller 13 for controlling the overall system. The data processing computer 11 controls operation of the controller 13, receives a clock pulse for system control from the controller 13, reads out waveform data of detected MR echo signals from a waveform memory 21, and performs predetermined reconstruction processing of the detected MR echo signals, thus generating a tomographic image of a predetermined slice portion of an object to be examined.

A coil assembly 31 formed of a plurality of coils for applying various types of magnetic fields to an object (not shown) is arranged in a gantry (not shown) in which the object is placed. The coil assembly 31 comprises a static magnetic field coil 32 for applying a static magnetic field having a predetermined intensity, a gradient magnetic field coil 33 for applying x-axis, y-axis, and z-axis gradient magnetic fields Gx, Gy, and Gz to the object, an RF coil 34 for supplying an RF pulse for exciting a spin, and a detection coil 35 for detecting an MR echo signal induced from an excited spin. The static magnetic field coil 32 is formed by, e.g., a superconducting coil or a normal conducting coil. It is noted that a single coil may be used as both the RF coil 34 and the detection coil 35. In this case, connection of the coil must be switched in such a manner that it is connected to a power amplifier 18 in the transmission mode and is connected to a preamplifier 19 in the reception mode.

A gradient magnetic field power supply 14 is connected between the controller 13 and the gradient magnetic field coil 33. A current to be supplied to the gradient magnetic field coil 33 is controlled by the controller 13 so as to apply the x-axis, y-axis, and z-axis gradient magnetic fields Gx, Gy, and Gz to the object. In this embodiment, the x-axis gradient magnetic field Gx, the y-axis gradient magnetic field Gy, and the z-axis gradient magnetic field Gz are mainly used as an encode gradient magnetic field Ge, a read gradient magnetic field Gr, and a slice gradient magnetic field Gs, respectively. A static magnetic field power supply 15 is connected to the static magnetic field coil 32. The static magnetic field power supply 15 controls a current to be supplied to the coil 32 so as to apply a static magnetic field Ho to the object.

An output from an RF oscillator 16 whose oscillation frequency is controlled by the controller 13 is supplied to the RF coil 34 through an attenuator 22, a gate circuit 17, and the power amplifier 18. As a result, an RF pulse is applied to the object. The attenuator 22 controls the amplitude of a current output from the RF oscillator 16 in accordance with a control signal from the controller 13. The transmission pulse power can be changed by the attenuator 22. The gate circuit 17 modulates an output signal from the attenuator 22 in response to a timing signal from the controller 13 so as to generate an RF pulse. It is possible to change the transmission pulse power by means of the amplification factor of the power amplifier 18.

The gradient magnetic field power supply 14 and the gate circuit 17 are driven by the controller 13 in accordance with a predetermined sequence so as to generate the x-axis gradient magnetic field Gx, the y-axis gradient magnetic field Gy, the z-axis gradient magnetic field Gz, and RF pulses of, e.g., a 90°-180° pulse series in accordance with a predetermined pulse sequence (to be described later).

An MR echo signal detected by the detection coil 35 is amplified by a preamplifier 19. An output from the preamplifier 19 is phase-detected by a phase detector 20. The phase-detected waveform signal is stored in the waveform memory 21. An output from the waveform memory 21 is supplied to the data processing computer 11.

In imaging, the controller 13 serves as a transmission pulse power control means for adjusting a flip angle $\theta$ of a spin to a desired value by setting the transmission power of an RF pulse generated by the RF coil 34 on the basis of the field intensity of an RF pulse which is always measured on a transaxial plane of a sectional plane to be imaged. For this purpose, the controller 13 excites the transaxial plane of the object prior to an actual imaging operation, and detects an MR signal from the object, e.g., a spin echo signal, through the detection coil 35. While changing the transmission pulse power within a predetermined range, the controller 13 detects the transmission pulse power value at which the maximum peak value of the received spin echo signal appears. The transmission pulse power at which a desired flip angle is obtained in an actual imaging operation is automatically set based on the detected transmission pulse power value at which the maximum peak value of the received spin echo signal appears.

In actual imaging, similar to a known apparatus, the controller 13 generates a timing signal for acquiring observation data of MR signals, and controls operations of the gradient magnetic field power supply 14 and the gate circuit 17 so as to control the generation sequence of the gradient magnetic fields Gx, Gy, and Gz and RF pulses in accordance with an imaging sectional plane.

An automatic power control method according to the embodiment will be described below with reference to a pulse sequence shown in FIG. 5. In this case, an imaging method using 90°-180° series RF pulses is used. However, the present invention is not limited to this imaging method. In a sequence of the spin echo method, data acquisition based on a multi-echo sequence can be performed, in which a plurality of MR echoes are sequentially generated by one MR excitation, and the MR data are acquired. For this reason, the spin echo method is often used for MR data acquisition by a multi-echo sequence.

In a time interval T1, the z-axis gradient magnetic field Gz as a slice gradient magnetic field and a 90° selective excitation pulse as an RF magnetic field are applied to the object to excite a specific slice of the object. In this case, a predetermined transaxial plane within an imaging region is excited to flip the magnetization vector (to be simply referred to as nuclear magnetization hereinafter) of the nuclear spin of a specific atomic nucleus in the slice through 90°. The 90° pulse is transmitted through the RF coil 34. In a time interval T2, a dephase gradient magnetic field is applied in the read direction (y direction) to disperse the angular phase of the nuclear magnetization. In a time interval T3, the slice gradient magnetic field Gz and a 180° pulse as an RF magnetic field are applied to the object to invert the nuclear magnetization. In a time interval T4, a rephase gradient magnetic field is applied in the read direction (y direction) to rephase and refocus the angular phase of the nuclear magnetization which has been dephased and dispersed upon application of the 90° pulse. With this operation, an MR echo signal (spin echo signal) is generated such that its peak appears a time TE (echo time) after the 90° pulse. The MR echo signal is acquired by the detection coil 35 to measure an RF field intensity. Although the 90° and 180° pulses have the same pulse width, their amplitude ratio is 1:2. The amplitudes of the 90° and 180° pulses are sequentially changed by the gate circuit 17.

The spin echo signal from the detection coil 35 is input to the data processing computer 11 through the preamplifier 19, the phase detector 20, and the waveform memory 21. The input spin echo signal is processed by the data processing computer 11. As a result, the peak value of the spin echo signal is detected.

Subsequently, the pulse sequence shown in FIG. 5 is repeated by variably controlling the attenuator 22 through the controller 13 in the same manner as described above. That is, while the transmission power (amplitude) of each RF pulse is changed, an excitation magnetic field is applied to an transaxial plane of an object P, and the peak value of a resultant spin echo signal is detected.

The data processing computer 11 then performs calculations such as curve fitting on the basis of the peak values of a plurality of spin echo signals acquired in this manner, thus setting a transmission pulse power at which the maximum peak value of a spin echo signal appears, i.e., a control status of the attenuator 22, in the controller 13. With this operation, in actual imaging, the flip angle $\theta$ of a spin is adjusted to a predetermined value of 90° or 180°.

Subsequently, an excitation magnetic field is applied to a desired sectional plane of the object P with the set transmission pulse power, and an MR signal from the object P is acquired through the detection coil 35, thereby obtaining image data. An image is reconstructed on the basis of the MR signal from the object P. For example, image processing including image reconstruction processing such as a two-dimensional Fourier transform is performed for the received MR data so as to generate a tomographic image of a desired slice portion of an object to be examined. The tomographic image is then displayed on a display device.

Figure 6:
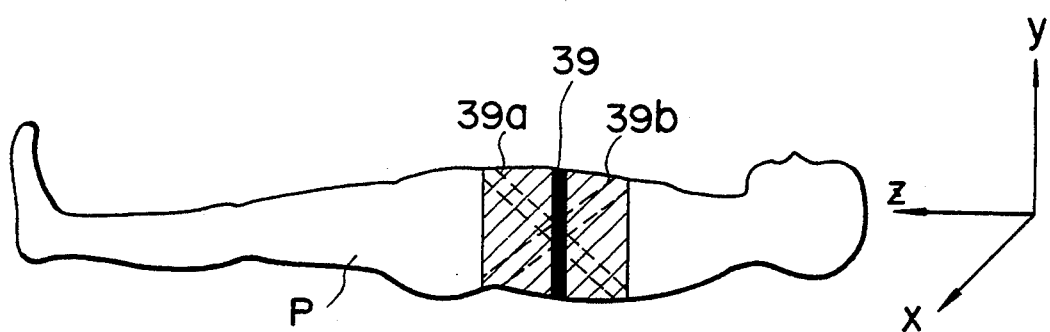
FIG. 6 is a view, showing a state wherein an abdominal portion is imaged, for explaining automatic power control according to the present invention.
Figure 7:
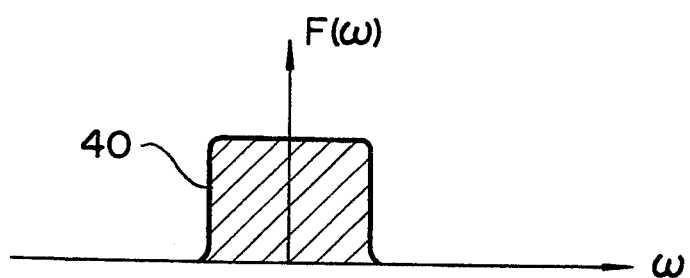
FIG. 7 is a graph showing projection data acquired in the system shown in FIG. 6.
Figure 8:
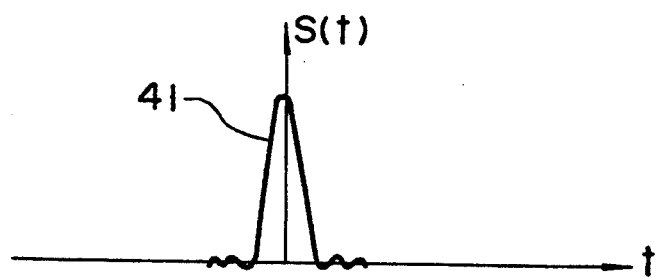
FIG. 8 is a graph showing a spin echo signal obtained in the system shown in FIG. 6.

As has been described above, according to this embodiment, the transmission power of an RF pulse for generating an exciting magnetic field is adjusted on the basis of a field intensity always measured at a transaxial plane 39 of the object P shown in FIG. 6 regardless of a sectional plane to be imaged. Therefore, when a condition in which a spin echo signal having a maximum or minimum peak value appears is to be obtained, a region, in which a nonuniform transmission magnetic field is present, other than an imaging region is not excited. The position of the transaxial plane in the direction of the axis of the body is not limited to the position indicated in FIG. 6. A transaxial plane can be set at an arbitrary position within an imaging region having a uniform field intensity (a hatched region in FIG. 6). For this reason, projection data $F(\omega)$ includes only a signal component 40 corresponding to the imaging region, as shown in FIG. 7. In addition, a spin echo signal 41 includes only a signal component within the imaging region. Therefore, a transmission pulse power, i.e., the optimal power condition of a 90° or 180° pulse can be obtained. This allows accurate setting of a transmission power for obtaining a desired flip angle for imaging, and hence an image having good contrast can be obtained.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, a plane used as a reference for automatic power control is not limited to an transaxial plane, and any plane can be used as long as it includes an object in an imaging region having a uniform field intensity but does not include an object outside the imaging region. In addition, such a plane may be slightly inclined with respect to a true transaxial plane and may be inclined to sectional planes 39a and 39b indicated by broken lines in FIG. 6. As described above, any plane may be used as an excitation sectional plane for automatic power control as long as it includes only an object within an imaging region having a uniform field intensity. Such a plane must cross the body axis of the object.

What is claimed is:

1. A magnetic resonance imaging system comprising:
   static magnetic field generating means for generating a static magnetic field in a predetermined imaging region in which an object to be examined is placed;
   gradient magnetic field applying means for applying a predetermined gradient magnetic field to said imaging region;
   radio frequency (RF) pulse applying means for applying a uniform RF pulse to said imaging region, a field intensity of said RF pulse being nonuniform outside of said imaging region;
   sequence control means for controlling said gradient magnetic field applying means and said RF pulse applying means in accordance with a predetermined pulse sequence so as to cause said gradient magnetic field applying means and said RF pulse applying means to respectively apply said predetermined gradient magnetic field and said RF pulse to said imaging region for causing a magnetic resonance phenomenon in said imaging region;
   receiving means for receiving a magnetic resonance signal generated by said magnetic resonance phenomenon within a given slice in said imaging region; and
   imaging processing means for obtaining a magnetic resonance image of a slice portion of said object which is along a longitudinal axis of said object and does not intersect said longitudinal axis, by performing predetermined processing, including image reconstruction processing, of said magnetic resonance signal received by said receiving means, wherein said sequence control means comprises adjusting means for adjusting a power value of an RF pulse for imaging prior to imaging processing, said adjusting means comprising:
   first means for exciting magnetic resonance at a slice portion of said object which crosses said longitudinal axis of said object regardless of an orientation of the magnetic resonance image obtained by said imaging processing means, the field intensity of said RF pulse being uniform within said slice portion excited by said first means;
   second means for operating said first means, with said power value of said RF pulse being variously set, for detecting magnetic resonance signals without applying an encode gradient magnetic field, and for obtaining a relationship between said power value of said RF pulse and peak values of said magnetic resonance signals detected; and
   means for determining a power value of said RF pulse for imaging processing on the basis of said relationship obtained by said second means so as to set a desired flip angle.

2. A system according to claim 1, wherein said first means comprises means for exciting magnetic resonance in a transaxial plane.

3. A system according to claim 1, wherein said first means comprises means for exciting magnetic resonance in a plane which crosses said body axis but does not cross two planes located at the edges of said imaging region in the direction of said body axis.

4. A system according to claim 1, wherein said first means comprises means for exciting a plane which crosses said body axis but does not include a portion of said object which is located outside said imaging region.

5. A system according to claim 1, wherein said RF pulse applying means comprises an RF oscillator, an attenuator for adjusting power of said RF pulse by adjusting an amplitude of an output from said oscillator, and an RF coil connected to said attenuator for applying said RF pulse to the object.

6. A system according to claim 1, wherein said adjusting means comprises:
   means for sequentially applying 90° and 180° pulses as RF pulses at predetermined time intervals,
   means for applying a slice gradient magnetic field when said 90° pulse is applied,
   means for applying a dephase gradient magnetic field in a read direction perpendicular to said body axis during a time period between application of said 180° pulse and application of said 90° pulse,
   means for applying a slice gradient magnetic field when said 180° pulse is applied, and
   means for receiving a magnetic resonance signal while applying a rephase gradient magnetic field in said read direction after application of said 180° pulse.

7. A method for adjusting the power of a radio frequency (RF) pulse of a magnetic resonance imaging apparatus for imaging a slice of an object, said slice being taken along a longitudinal axis of said object and not intersecting said longitudinal axis of said object, said method comprising:
   a first step of exciting a slice portion, which intersects said longitudinal axis of said object, prior to imaging regardless of the orientation of the slice to be imaged by the magnetic resonance imaging apparatus, a field intensity of the RF pulse being uniform within said slice portion excited by said first step, receiving a magnetic resonance signal, and detecting a peak value of said magnetic resonance signal;
   a second step of repeating said first step while variously changing excitation power;
   a third step of detecting excitation power at which a maximum peak value of a magnetic resonance signal is obtained; and
   a fourth step of determining transmission power of an RF pulse for imaging on the basis of said excitation power detected in said third step.

8. A method according to claim 7, wherein said magnetic resonance imaging apparatus images one of a coronal plane and a sagittal plane and said first step includes a step of exciting a transaxial plane.

9. A method according to claim 7, wherein said fourth step includes a step of determining said transmission power of said RF pulse for imaging, on the basis of excitation power at which said maximum peak value of said magnetic resonance signal is obtained, for setting a flip angle to be 90° or 180°.

* * * * *